United States Patent
Yamada et al.

(10) Patent No.: US 6,594,289 B2
(45) Date of Patent: Jul. 15, 2003

(54) TUNABLE LASER SOURCE APPARATUS

(75) Inventors: Atsushi Yamada, Atsugi (JP);
Shigenori Mattori, Sagamihara (JP)

(73) Assignee: Anritsu Corporation, Tokyo (JP)

( * ) Notice: Subject to any disclaimer, the term of this patent is extended or adjusted under 35 U.S.C. 154(b) by 64 days.

(21) Appl. No.: 09/741,275

(22) Filed: Dec. 19, 2000

(65) Prior Publication Data

US 2001/0005387 A1 Jun. 28, 2001

(30) Foreign Application Priority Data

Dec. 22, 1999  (JP) .......................................... 11-365047

(51) Int. Cl.$^7$ ................................................. H01S 3/10
(52) U.S. Cl. ......................................... 372/20; 250/226
(58) Field of Search ............................. 372/20; 250/226

(56) References Cited

U.S. PATENT DOCUMENTS 5,754,571 A  *  5/1998  Endoh et al. ................. 372/20
6,081,539 A       6/2000  Mattori et al.
6,144,025 A  *  11/2000  Tei et al. .................... 250/226

* cited by examiner

Primary Examiner—Paul Ip
Assistant Examiner—Tuan Nguyen
(74) Attorney, Agent, or Firm—Frishauf, Holtz, Goodman & Chick, P.C.

(57) ABSTRACT

A tunable laser source apparatus including an external cavity has a semiconductor laser and a wavelength selector. The semiconductor laser includes a reflection surface, a surface with an anti-reflection film and an active layer. The selector selects from laser light emitted from the laser through the surface with the anti-reflection film and feeding laser light of a desired wavelength back to the laser through the surface with the anti-reflection film. The semiconductor laser has a window region formed between a tip portion of the active layer extending toward the surface with the anti-reflection film and the surface with the anti-reflection film, the window region allowing the laser light of the desired wavelength fed back from the selector to be coupling thereon, while dilating the beam size of a portion of the laser light which is reflected from the surface with the anti-reflection film and reach the tip portion film.

4 Claims, 7 Drawing Sheets

1A(1)

WITHOUT GAP (VIRTUAL)

SUFFICIENTLY LARGE PHOTO-DETECTING AREA

GAP SIZE EQUAL TO BEAM RADIUS

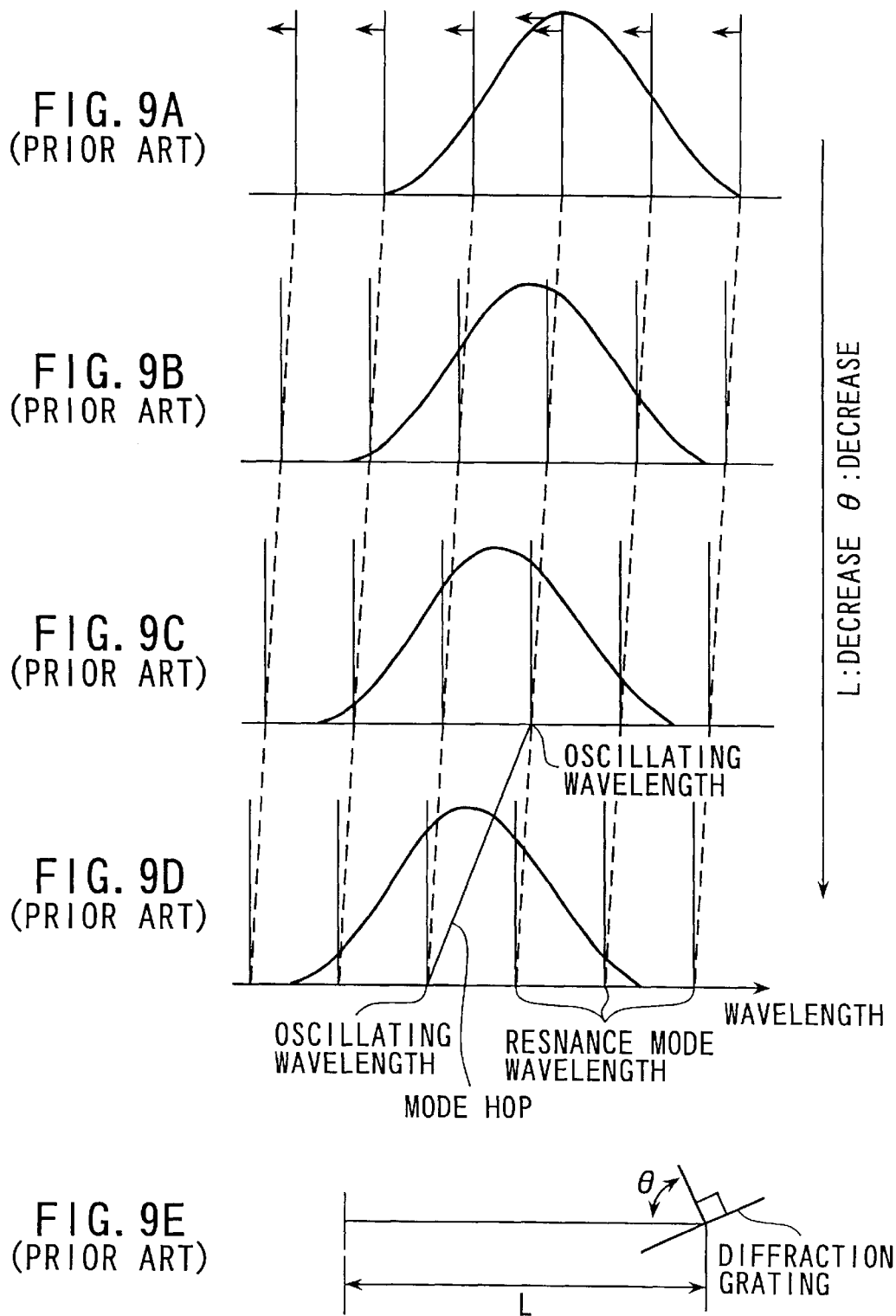

TUNABLE LASER SOURCE APPARATUS

CROSS-REFERENCE TO RELATED APPLICATIONS

This application is based upon and claims the benefit of priority from the prior Japanese Patent Application No. 11-365047, filed Dec. 22, 1999, the entire contents of which are incorporated herein by reference.

BACKGROUND OF THE INVENTION

The present invention relates to a tunable laser source apparatus that can vary an oscillating wavelength used in the field of optical communications and precision measurements, and in particular, to a tunable laser source apparatus that can continuously sweep the oscillating wavelength over a wide band using an optical amplifying function as provided by a semiconductor laser, which covers a range of wavelengths over a wide band (hereafter referred to as an "LD").

Various optical parts such as an optical fiber amplifier, an optical filter, and an optical isolator as well as each device constituting a transmission system which are all used for wavelength multiplexed communication must have their wavelength band characteristics measured.

Thus, a tunable laser source apparatus for a wide band is required which provides light of a predetermined wavelength.

In this case, the ability to continuously sweep the wavelength is desirable.

A tunable laser source apparatus called an "external cavity laser" has been spread which passes light from an optical amplifying element such as an LD which has a wide gain band, through a wavelength selecting element such as a diffraction grating which is arranged outside the element, to feed back light of a desired wavelength band, thereby causing laser oscillation within that wavelength band.

In this case, the most commonly used wavelength selecting element is a diffraction grating.

That is, a selected wavelength is varied by varying the angle of the diffraction grating relative to an incidence direction of light.

FIG. 8A is a view useful in explaining the configuration of a tunable laser source apparatus of this kind, that is, a typical external cavity laser using a diffraction grating.

In addition, FIGS. 8B, 8C, 8D, and 8E are views useful in explaining the principle of wavelength determination.

That is, an external cavity laser such as that shown in FIG. 8A comprises an LD 51 with an anti-reflection film (hereafter referred to as an "AR coat) applied to one end surface 51a, lasers 52a and 52b, and a diffraction grating 53 arranged on the AR-coated end surface 51a.

The diffraction grating 53 is capable of rotation and translation.

The diffraction grating 53 and the other surface (the end surface that is not AR-coated) of the LD 51b constitute an external cavity.

Such an arrangement of the diffraction grating 53 that light from the LD51 is diffracted directly to the LD51 by the diffraction grating 53, which receives the light, so that the light has a selected wavelength, is called a "Littrow mounting".

Regardless of the use of the Littrow mounting, the oscillating wavelength of an external cavity laser including a wavelength selecting element is determined by two factors.

One of them is a wavelength that meets resonance conditions determined by the optical length of the entire resonator that causes laser oscillation.

In an optical resonator such as that shown in FIG. 8B, the optical length of the entire resonator (hereafter referred to as the "resonator length") is denoted by L, the frequency of incident light is denoted by $\upsilon$, the power of incident light is denoted by P0, and the power of emitted light is denoted by P1.

As is well known, when the light speed is denoted by c, the free spectral range (hereafter referred to as the "FSR") is expressed by:

$$(FSR=c/(2L)).$$

As shown in FIG. 8C, for each FSR, there are a plurality of resonance frequencies at which transmittance (the power of emitted light P1/the power of incident light P0) is maximized.

When a resonance frequency is n times as large as the FSR, this frequency is called an "n order mode".

Here, a wavelength corresponding to such a resonance frequency is called a "resonance wavelength".

The other is the distribution of a gain with its band limited by a diffraction grating such as that shown in FIG. 8D or a general wavelength selecting element.

If the optical amplifying element such as the LD which has a gain over a wide band is used, the gain of the diffraction grating within a selected wavelength band is constant.

Thus, the distribution of the gain with its band limited may be considered to be identical to a selected wavelength spectrum of the diffraction grating.

Accordingly, a peak wavelength of the selected wavelength spectrum is hereafter simply called a "selected wavelength".

Then, one of the modes which is located at a frequency having the highest gain starts to oscillate as shown in FIG. 8E.

In general, the selected wavelength does not equal the oscillating wavelength.

FIGS. 9A, 9B, 9C, 9D, and 9E shows variations in oscillating wavelength observed when the change rates of the resonance and selected wavelengths are not equal.

When a resonator length L and an incident angle θ at which light is incident on the diffraction grating, both of which are schematically shown in FIG. 9E, are progressively reduced, the resonance and selected wavelengths shift toward a short wavelength side.

At this point, if a difference corresponding to the half of the FSR occurs between the resonance wavelength of the oscillating mode and the selected wavelength, the oscillating wavelength shifts from the oscillating mode to the adjacent one in such a manner that the state in FIG. 9C shifts to the state in FIG. 9D.

This phenomenon is called a "mode hop" or "mode jump".

Thus, to continuously vary the oscillating wavelength over a wide band, the oscillating resonance wavelength and the selected wavelength are linked together, that is, in the Littrow-mounting external-resonance laser, the resonator length and the angle of the diffraction grating are simultaneously varied while being maintained in an appropriate relationship, to restrain the mode hop.

Furthermore, in the tunable laser source apparatus having the external cavity structure such as the diffraction grating, the reflectivity on the external cavity side of the LD must be reduced to restrain internal modes of the LD.

Thus, a configuration with an AR coat comprising a dielectric film, that is, a configuration such as that shown in FIG. 8A which has the AR coat applied to the end surface 51a of the LD 51 is conventionally used.

The configuration with the AR coat simply applied to the end surface 51a of the LD 51, however, provides an insufficient achievable reflectivity, and significant internal modes result from residual reflectivity.

Thus, such a configuration has the following adverse effects: the mode hop occurs as descried above, which may lead to multimode oscillation, and the variable wavelength band is insufficient, thereby increasing spontaneous emitted radiation.

BRIEF SUMMARY OF THE INVENTION

It is an object of the present invention to provide a tunable laser source apparatus that is developed in view of the above problems, that can sufficiently restrain internal modes of an LD to reduce spontaneous emitted radiation in order to prevent multimode oscillation, and that can extend a wavelength varying range.

To attain the above object, according to one aspect of the present invention, there is provided a tunable laser source apparatus including an external cavity, the apparatus comprising:

a semiconductor laser including a reflection surface formed on one end, a surface with an anti-reflection film formed on the other end, and an active layer extending from the reflection surface toward the surface with the anti-reflection film; and wavelength selecting means for selecting from laser light emitted from the semiconductor laser through the surface with the anti-reflection film and feeding laser light of a desired wavelength back to the semiconductor laser through the surface with the anti-reflection film, wherein the semiconductor laser has a window region formed between a tip portion of the active layer extending toward the surface with the anti-reflection film and the surface with the anti-reflection film, the window region allowing the laser light of the desired wavelength fed back from the wavelength selecting means to be coupling thereon, while dilating the beam size of a portion of the laser light which is reflected from the surface with the anti-reflection film and reach the tip portion film.

Additionally, according to another aspect of the present invention, there is provided a tunable laser source apparatus including an external cavity according to, the apparatus further comprising:

angle detecting means for detecting an angle between an optical axis of light emitted from the semiconductor laser and an optical axis of diffracted light reflected from the wavelength selecting means; and a control section for changing at least one of a resonator length of the external cavity and a selected wavelength of the wavelength selecting means so that the angle detected by the angle detecting means is zero.

Further, according to yet another aspect of the present invention, there is provided a tunable laser source apparatus including an external cavity according to, wherein the wavelength selecting means includes a diffraction grating and a reflector.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is a view showing the configuration of the angle detecting section, FIG. 3B is a view showing the locational relationship between a photo-detector and a light beam, and FIGS. 3C and 3D are graphs useful in explaining the relationship between a detected signal and the locational relationship between the photo-detector and the light beam;

FIG. 4A is a graph showing the relationship between a standardized determination signal and displacement of irradiation point, FIG. 4B is a graph showing the relationship between standardized light intensity and distance, and FIGS. 4C and 4D show examples of the shape of a photo-detecting area of a split photo-detector, wherein in one of the example, there is a gap between the photo-detectors, while in the other, there is no gap therebetween;

FIG. 8B is a view showing an optical resonator, FIG. 8C is a graph showing transmittance, FIG. 8D is a graph showing the relationship between wavelength and gain, and FIG. 8E is a graph showing the relationship between oscillating wavelength and selected wavelength and resonance wavelength; and FIGS. 9A to 9E are views useful in explaining variations in oscillating wavelength wherein change rates of the wavelength and the selected wavelength are not equal, in which FIGS. 9A to 9D are graphs showing the relationship between oscillating wavelength and selected wavelength and resonance wavelength observed when an incident angle θ is varied step by step, and FIG. 9E is a view schematically showing a resonator length L and the incident angle θ.

DETAILED DESCRIPTION OF THE INVENTION

Figure 1:
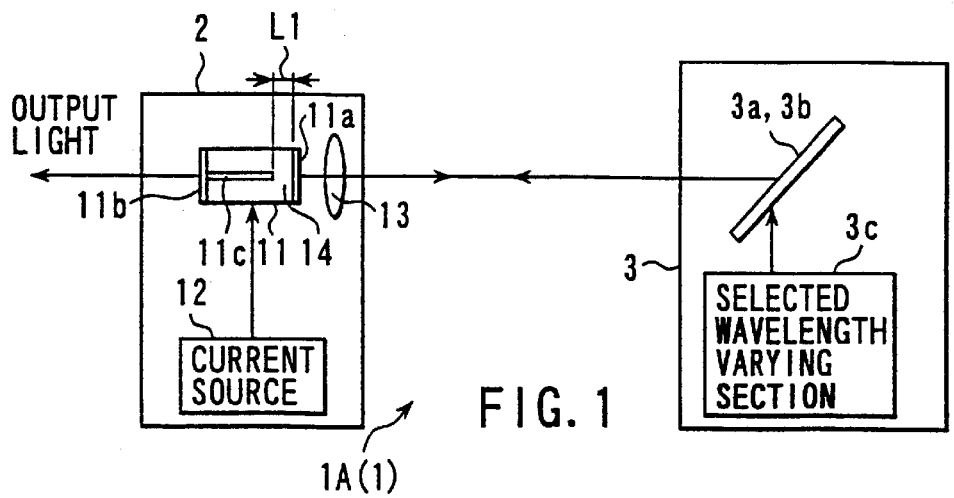
FIG. 1 is a block diagram showing the configuration of a first embodiment of a tunable laser source apparatus according to the present invention.

Reference will now be made in detail to the presently preferred embodiments of the invention as illustrated in the accompanying drawings, in which like reference numerals designate like or corresponding parts.

The present invention will be described in brief.

A tunable laser source apparatus according to the present invention is a tunable laser source apparatus 1 including an external cavity comprising an LD 11 for oscillating laser light and diffraction section 3 as wavelength selecting section for diffracting laser light emitted from the LD to feed laser light of a predetermined wavelength back to the ED through a surface with an anti-reflection film, characterized in that the LD has an AR coat applied at least to an emission end surface 11a opposite to the diffraction section side, and includes a window region 14 formed to prevent an active layer 11c from reaching the end surface with the AR coat applied thereto.

The window region 14 is formed between a tip portion of the active layer extending toward the surface with the anti-reflection film and the surface with the anti-reflection film, and allows laser light of a desired wavelength fed back from the wavelength selecting section to be coupling thereon, while dilating the beam size of a portion of the laser light which is reflected from the surface with the anti-reflection film and reach said tip portion film.

Thus, the reflectivity can be equivalently improved to sufficiently restrain internal modes of the LD caused by residual reflectivity, to reduce spontaneous emitted radiation to thereby prevent multimode oscillation, while extending a wavelength varying range.

(First Embodiment)

FIG. 1 is a block diagram showing the configuration of a first embodiment of a tunable laser source apparatus according to the present invention.

The tunable laser source apparatus according to the first embodiment principally comprises an optical amplifying section 2 and a diffraction section 3 as wavelength selecting section including a diffraction grating 3a also acting as a first reflector 3b, as shown in FIG. 1.

In this case, the optical amplifying section 2 includes an LD 11, a current source 12, and a lens 13.

The LD 11 is driven by the current source 12, and one 11a of laser light emitted end surfaces which is located on a diffraction section 3 side is AR-coated with a dielectric film as a surface with an anti-reflection film, while the other laser light emitted end surface 11b is used as a second reflector as a reflection surface.

The LD 11 includes a window region 14 formed to have a length L1 (for example, 20 to 30 μm) from the end surface 11a so as to prevent the striped active layer 11c from reaching the end surface 11a.

The window region 14 is formed between a tip portion of the active layer 11c extending toward the surface 11a with the anti-reflection film and the surface 11a with the anti-reflection film, and allows laser light of a desired wavelength fed back from the diffraction section 3 as the wavelength selecting section to be incident thereon, while diffusing a portion of the laser light of the desired wavelength which is reflected from the surface 11a with the anti-reflection film.

This provides a tunable laser source apparatus that can equivalently improve the reflectivity to sufficiently restrain internal modes of the LD caused by residual reflectivity, to reduce spontaneous emitted radiation to thereby prevent multimode oscillation, while extending the wavelength varying range.

For the window region 14, if the length L1 from the end surface 11a is large, light will be absorbed or scattered by the window region 14, and will thus be spread and cannot be coupled together easily. Consequently, in this example, the length is set at an appropriate value (for example, about 20 to 30 μm) for obtaining a sufficient coupling.

Then, the lens 13 converts diverging light emitted from the AR-coated end surface 11a of the LD 11 into parallel light before the light is incident on the diffraction grating 3a.

In addition, the diffraction section 3 includes a diffraction grating 3a arranged based on the Littrow mounting and also acting as a first reflector 3b, and a mechanism (selected wavelength varying section 3c) for rotating the diffraction grating 3a.

(Second Embodiment)

Figure 2:
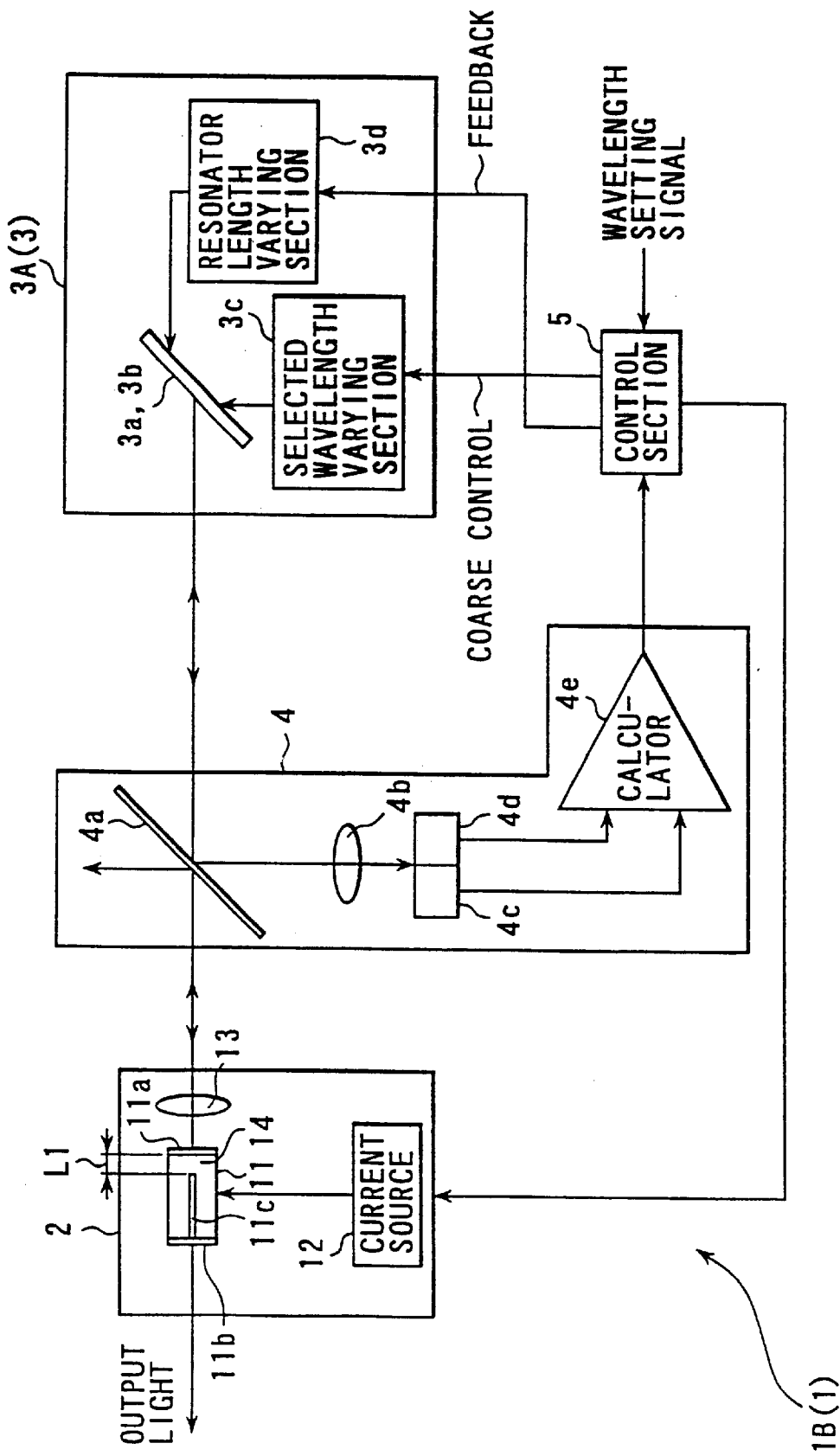
FIG. 2 is a block diagram showing a second embodiment of a tunable laser source apparatus according to the present invention.

FIG. 2 is a block diagram showing the configuration of the second embodiment of the tunable laser source apparatus according to the present invention.

In FIG. 2, the same components as those of the tunable laser source apparatus 1A shown in FIG. 1 have the same reference numerals, and description thereof is omitted.

A tunable laser source apparatus 1B(1) according to the second embodiment principally comprises the optical amplifying section 2, the diffraction section 3 as the wavelength selecting section including the diffraction grating 3a also acting as the first reflector 3b, an angle detecting section 4, and a control section 5, as shown in FIG. 2.

That is, the tunable laser source apparatus 1B employs a configuration wherein the angle detecting means 4 is added to the external cavity laser using the diffraction grating 3a based on the Littrow mounting, to achieve feedback control.

In FIG. 2, the diffraction section 3 includes the diffraction grating 3a also acting as the first reflector 3b, and a mechanism (the selected wavelength varying section 3c and a resonator length varying section) for rotating and translating the diffraction grating 3a.

The angle detecting section 4 comprises a beam splitter 4a, a lens 4b, photo-detectors 4c and 4d, and a calculator 4e.

The beam splitter 4a is arranged between the AR-coated end surface 11a of the LD 11 and the diffraction section to branch and obtain a portion of light directed from the diffraction section 3 to the LD 11.

Additionally, the lens 4b collects the light branched by the beam splitter 4a and allows it to enter the photo-detectors 4c and 4d.

In this example, light beams incident on the lens 4b are parallel, so that a light beam emitted from the lens 4b is thinnest near the focus.

Thus, the photo-detectors 4c and 4d are arranged near the focus of the lens 4b to detect the power of light in right and left halves of a light beam branched by the beam splitter 4a, under an oscillating wavelength with which the mode hop is unlikely to occur.

That is, the photo-detectors 4c and 4d are arranged so as to each receive half of the light beam branched by the beam splitter 4a when the angle between the optical axis of light directed from the diffraction grating 3a to the LD 11 and the optical axis of light directed from the LD 11 to the diffraction grating 3a is 0°.

In addition, based on photo detection signals from the photo-detectors 4c and 4d, the calculator 4e detects the power of light corresponding to the angle between the optical axis of light directed from the optical amplifying section 2 to the diffraction section 3 and the optical axis of light returning from the diffraction section 3 to the optical amplifying section 2.

In this example, the calculator 4e comprises a differential amplifier that receives signals from the photo-detectors 4c and 4d to output the difference between the signals as an error signal.

The control section 5 sets the current source 12 and the diffraction section 13 for predetermined operational conditions based on an external wavelength setting signal, and receives the error signal output from the angle detecting section 4 to control the diffraction section 3.

The operation of the angle detecting section 4 will be described with reference to FIGS. 3A to 3D.

Figure 3A:
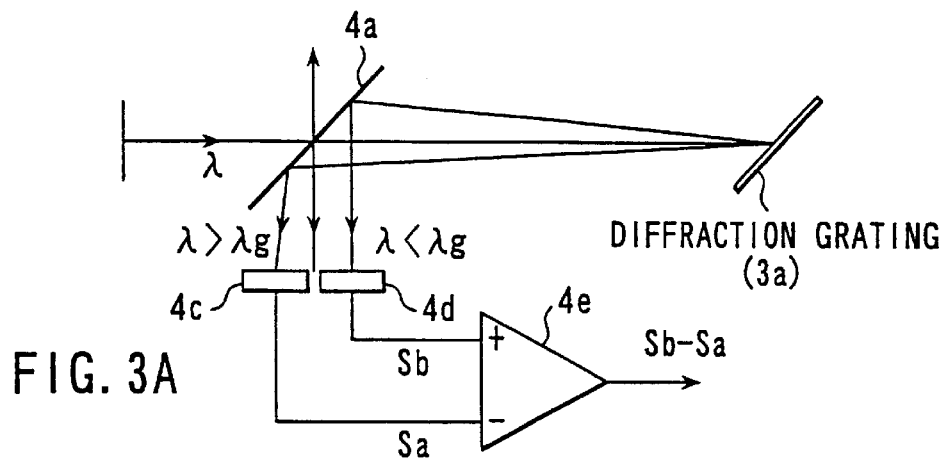
FIGS. 3A to 3D are views useful in explaining the operation of angle detecting section in FIG. 2.

FIG. 3A schematically shows the configuration of the angle detecting section 4 in FIG. 2 and the positions of light beams therein.

Figure 3B:
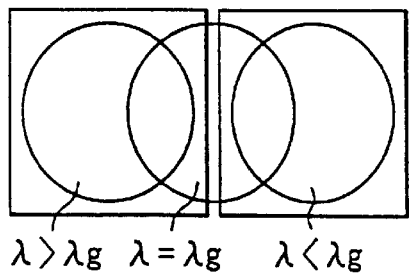

FIG. 3B shows the positions of a photo-detecting surface and a light beam relationship therebetween.

The beam splitter 4a, the photo-detectors 4c and 4d are arranged to meet the locational relationship shown in FIG. 3A, and the calculator 4e calculates the difference between two photo-detecting signals.

Further, the relationship between the photo-detecting surface of the photo-detector and a light beam may be such that, for example, two photo-detectors 4c and 4d each having an effective photo-detecting area may be arranged so that the quantities of light received by the two photo-detectors 4c and 4d are equal when the oscillating wavelength $\lambda$ equals the selected wavelength $\lambda$ g, that is, when the laser is oscillated with a wavelength at which the mode hop is unlikely to occur, as shown in FIG. 3B.

If the actual photo-detecting surface is too small for the beam size, an appropriate lens or the like may be used to adjust the thickness.

Figure 3C:
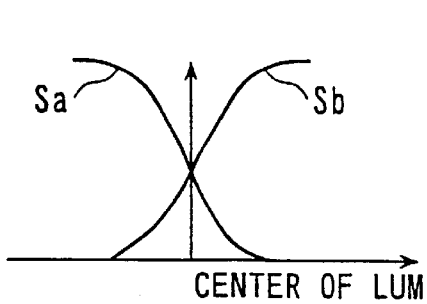

FIG. 3C shows photo-detecting signals from the photo-detectors 4c and 4d for the difference between the selected wavelength $\lambda$ g and the oscillating wavelength $\lambda$.

Then, if the total power of light in fluxes directed to the photo-detectors 4c and 4d is constant, it is natural that when the light beam moves leftward from the center, the power of light received by the left photo-detector 4c increases to enhance a photo-detecting signal Sa, while weakening a photo-detecting signal Sb from the right photo-detector 4d.

Figure 3D:
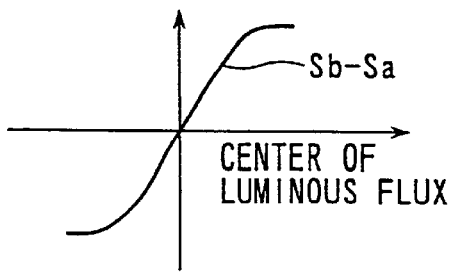

Accordingly, when the calculator 4e calculates the difference Sb-Sa between the two photo-detecting signals, an error signal such as that shown in FIG. 3D is obtained.

To remove variations in the total power of light in the light beams directed to the photo-detectors 4c and 4d, the calculator 4e may calculate (Sb−Sa)/(Sb+Sa).

Detection sensitivity for the error signal will be considered with reference to FIGS. 4A to 4D.

The light beam is assumed to be of the Gaussian type, and a two-piece photo-detector that is sufficiently wider than the beam size is considered.

Figure 4A:
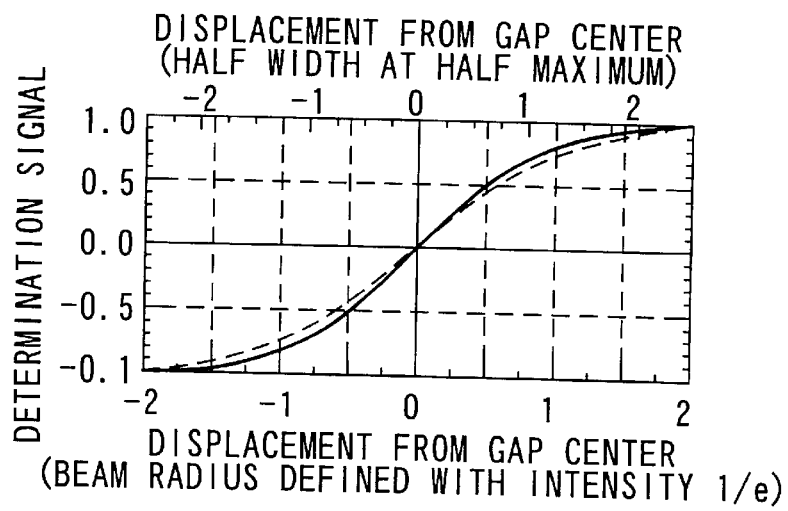
FIGS. 4A to 4D are views useful in explaining detection sensitivity for error signals from the angle detecting section in FIG. 2.
Figure 4B:
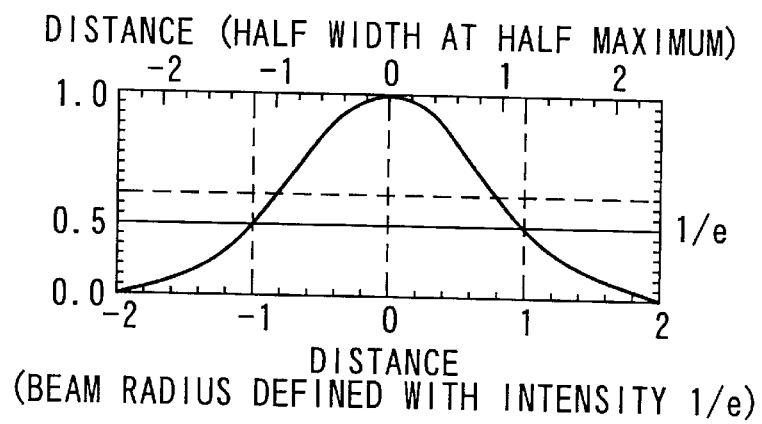

FIG. 4B shows the distribution of the intensity of a Gaussian light beam where the beam radius is used as the unit of the axis of abscissa.

The beam radius is defined both as a distance with which the intensity decreases down to one-e-th (e is a natural logarithm) of the center of the light beam and as a distance (half width at half maximum) with which the intensity decreases down to half of the center of the light beam.

Figure 4C:
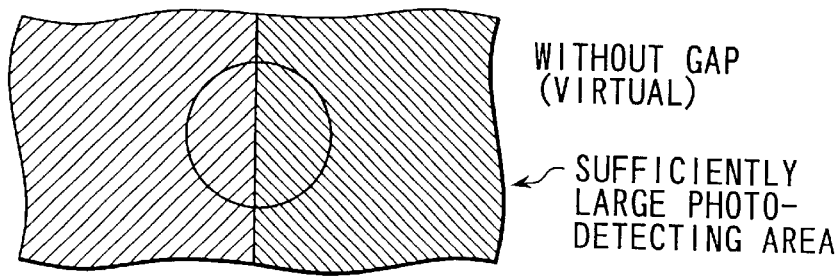
Figure 4D:
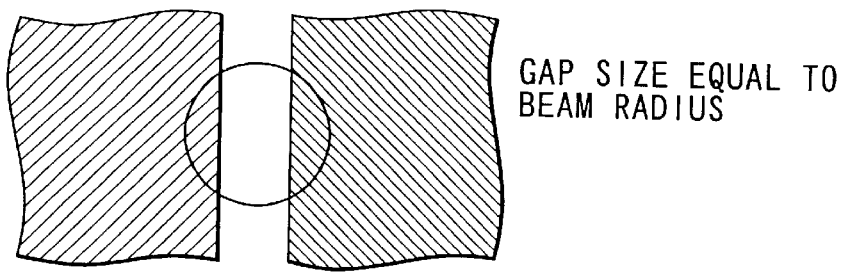

FIGS. 4C and 4D show examples of the shape of a photo-detecting area of the split photo-detector.

Here, FIG. 4C shows a case where there is no gap between the two photo-detecting areas obtained by virtual division.

Additionally, FIG. 4D shows a case where the gap equals the beam radius defined by one-e-th of the intensity of the light beam.

The circles in FIGS. 4C and 4D are drawn with the beam radius defined by one-e-th of the intensity of the light beam, and show the relationship between the size of the gap and the beam size.

FIG. 4A shows a determination signal (Sb−Sa)/(Sb+Sa); the solid line corresponds to FIG. 4C, whereas the broken line corresponds to FIG. 4D.

In this case, the origin of the axis of abscissa in FIG. 4A is set based on a case where the center of the light beam is located on the splitting line.

The inclination of the solid line in FIG. 4A near the origin, that is, the detection sensitivity based on the beam radius is about 0.94 $(2(\log 2/\pi)^{1/2})$ when the beam radius corresponds to the half width at half maximum (HWHM) shown on the axis of abscissa.

This inclination is actually smaller due to the gap between the photo-detecting areas, but the inclination of about 0.8 is obtained near the origin even with a gap equal to the beam radius as shown by the broken line.

Since the beam size incident on the photo-detector can be varied using a lens or the like, the decrease in detection sensitivity caused by the gap poses no problem if the thickness is appropriate for the shape of the photo-detecting area.

On the other hand, the wavelength resolution of the diffraction grating is the amount of variations in wavelength that cause the diffraction direction to shift by the half width at half maximum of the beam.

Thus, when the difference between the oscillating wavelength and the selected wavelength is one-tenth of the resolution of the diffraction grating, the determination signal is about 0.8, corresponding to about 8% of a full scale (0 to 1 of the axis of ordinate in FIG. 4A). That is, the detection sensitivity is sufficient.

With the Littrow mounting, which is often used for the external cavity laser using the LD, the ratio between the resolution of the diffraction grating and the FSR of the resonator is about 5 or more.

Accordingly, effectively controlling this configuration requires a detection sensitivity sufficient to detect the difference between the oscillating wavelength $\lambda$ and the selected wavelength $\lambda$ g with about one-tenth or smaller of the resolution of the diffraction grating.

The value of the above described error signal means that a sufficiently determinable signal can be obtained even with observations with a low SN ratio.

The positions of the photo-detectors are desirably initially adjusted so that the two photo-detecting signals are as equal as possible under conditions that restrain the mode hop.

This example, however, enables compensation with electric processing for obtaining the error signal from the photo-detecting signals, despite incomplete alignment of the photo-detector or temporal variations.

If, for example, the calculator 4e calculates Sb−g·Sa, varying the coefficient g relative to 1 is almost equivalent to simultaneously moving the photo-detectors 4c and 4d in a lateral direction.

Consequently, it is not necessary to make mechanical adjustments by unsealing and disassembling the apparatus.

There are various possible methods for arranging the photo-detectors 4c and 4d other than the method shown in FIG. 3A where the same diffracted light beam is split and received.

Figure 5:
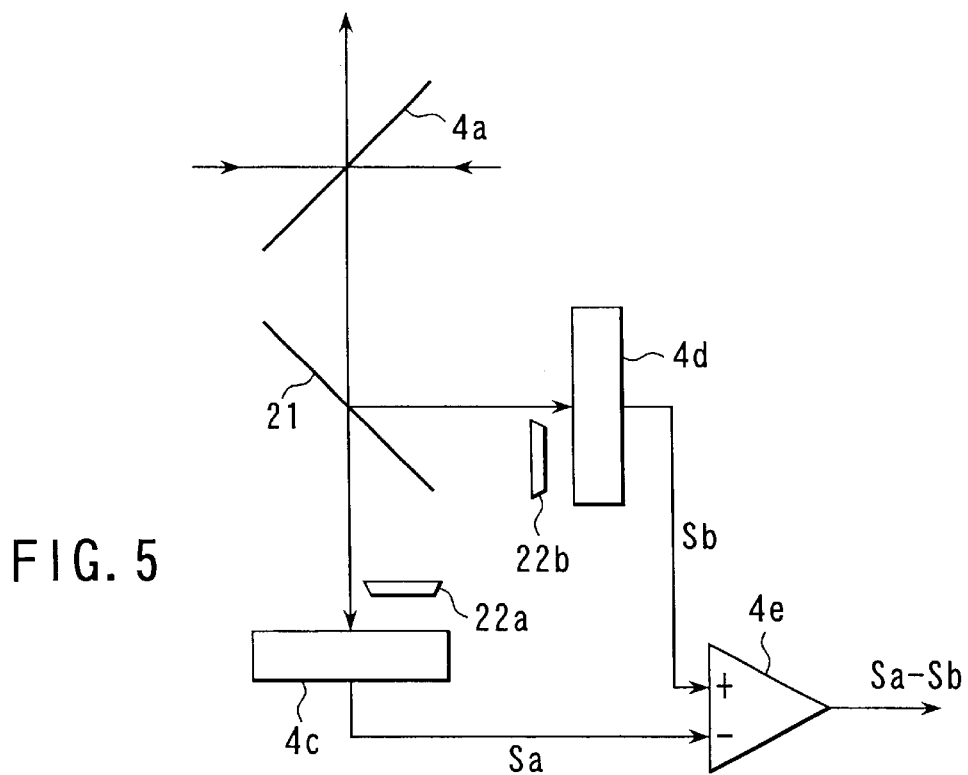
FIG. 5 is a view showing another example of the configuration of the angle detecting section in FIG. 2.

FIG. 5 shows an example of such a configuration.

With this arrangement, light spitted by the beam splitter 4a is further spitted by a second beam splitter 21, and shielding plates 22a and 22d are arranged in two light beams obtained by the splitting so that the light beams are received by the photo-detectors 4c and 4d.

In this case, when the shielding plate 22a or 22d is used to shield the right or left half of each light beam, this configuration is equivalent to that in FIG. 3A.

Additionally, without the shielding plate 22a, if the second beam splitter 21 has a branching ratio of, for example, 1:1, an error signal similar to that in FIG. 3A is obtained by using the calculator 4e to calculate Sb−Sa/2 based on the photo-detecting signals Sa and Sb.

In this case, if the total power of light corresponding to the photo-detecting signal Sa varies, the error signal is not affected.

Alternatively, since the photo-detector 4c outputs the photo-detecting signal Sa proportional to the total power of light spitted by the beam splitter 4a, when current injected into the LD 11 is controlled so that the photo-detecting signal Sa is maintained at a constant value S0, the calculator 4e receives only the photo-detecting signal Sb to calculate Sb−S0/2.

Further, the shielding plates 22a and 22b may be omitted and the photo-detectors 4c and 4d may be shifted from the center of the light beam so that half of the light beam is incident on the effective photo-detecting surface.

Since the feedback control is assumed herein, the example with the two photo-detectors has been shown so as to simplify the process for generating the error signal from observation signals.

However, an approach may also be used which detects movement of a centroid in the distribution of the intensity of a light beam using a CCD (Charge-Coupled Device) array that detects the intensity distribution in one- or two-dimensional manner or which uses an element converts the position of an irradiation point into an electric resistance.

Other possible methods include receiving light spitted upward in FIG. 3A by means of the beam splitter 4a, that is, light directed from the LD 11 to the diffraction grating 3a, to use the power of this light and one of the photo-detectors 4c and 4d in FIG. 3A, and using only one of the photo-detectors 4c and 4d in FIG. 3A, but these methods are disadvantageous in that the error signal is affected by diffraction efficiency or variations in the total power of light.

It is also possible to insert the photo-detectors 4c and 4d into part of the light beam within the external cavity without the use of the beam splitter 4a, but the intensity distribution of the light beam may be disturbed to reduce the resolution of the diffraction grating or stray light may be fed back to the LD 11 to make oscillation unstable.

Additionally, the feedback control can be intended for one or both of the resonator length, that is, the oscillating wavelength and the selected wavelength, but the resonator length is generally controlled.

The reason is as follows: The oscillating wavelength is present in the selected wavelength band, and there are a plurality of resonance wavelengths. Thus, in applications that oscillate the laser near a desired wavelength, it is natural to set a selected wavelength to allow the resonance wavelength to follow this selected wavelength.

In addition, if the oscillating wavelength is changed to one that is not continuous therewith and that is substantially separated therefrom, it is difficult to promptly change the wavelength using the method for allowing the resonance wavelength to follow the selected wavelength.

Of course, means for varying the resonance wavelength and the selected wavelength is often implemented using mechanical displacement, so the maximum displacement and displacement resolution of the varying means are restricted.

Thus, if it is easier to control the resonance wavelength so as to follow the selected wavelength, this may be controlled.

In the tunable laser source apparatus of this example described above, the laser is oscillated at a single resonance mode wavelength within a selected wavelength band based on the resonator length of the external cavity configured between the light emitting end surface 11b of the LD 11 and the diffraction grating 3a of the diffraction means 3.

The beam splitter 4a provided in the external cavity branches a portion of light fed back from the diffraction section 3 to the LD 11, so that the power of light in substantially the right and left halves of the branched light beam is received by the photo-detector 4c and 4d and converted into electric signals.

The two signals obtained are input to the calculator 4e, and the difference between them is calculated and converted into a signal substantially proportional to the angle between the optical axis of light directed from the LD 11 to the diffraction grating 3 and the optical axis of light directed from the diffraction section 3 to the LD 11.

This signal indicates the separation between the oscillating wavelength and the selected wavelength, together with their magnitude relationship.

When the control section 5 feeds this signal back to the resonator length varying means (diffraction grating translating mechanism) 3d, the control loop is closed to allow the oscillating wavelength to follow the selected wavelength.

The two photo-detecting areas of the photo-detectors 4c and 4d are desirably close to each other, so that a photodiode with a two-piece photo-detecting area is used in this example.

In this example, the lens 4b is provided and the photo-detectors 4c and 4d are arranged near its focus; this configuration is used to maximize the detection sensitivity of the angle detecting section 4 and to reduce the distance between the beam splitter 4a and the photo-detectors 4c and 4d.

In general, if variations in the angle of the light beam are to be detected from displacement of the light beam on an observation plane, the distance between a location where the variation occurs and the observation plane is proportional to the displacement of the light beam on the observation plane.

On the other hand, the beam radius of the light beam increases linearly with the distance between a beam waist position and the observation plane, but these increases are not based on a simple proportional relationship.

In the case of the external cavity type laser, the light beam at the location where the angle varies comprises parallel beams, so that the location where the angle varies can be considered to be identical to the beam waist position.

Accordingly, the distance to the observation plane is substantially proportional to the beam radius at a location sufficiently remote from the beam waist position, whereas the difference increases gradually near the beam waist.

Thus, if the displacement of the light beam is to be measured based on the beam radius, there is preferably a larger distance between the location where the angle varies and the observation plane.

As a numerical example, with a Gaussian light beam of wavelength 1.55 $\mu$m and beam radius 1 mm, the far end of a Fresnel area is about 4 m away from the beam waist.

The displacement of the light beam based on the beam radius in this case is about 0.7 times ($=\frac{1}{2}^{1/2}$) as large as that at the point at infinity, and the observation plane is desirably 10 m or more away from the beam waist.

Actually setting the observation plane at such a remote position may require the size of the apparatus to be increased and result in adverse effects such as vibration and the fluctuation or scattering of air in the optical path.

Thus, in this example, the lens 4b is used to subsequently obtain a reduced far-field pattern on a focal plane, where light is received. In the above described numerical example, if the observation plane is set 10 m away, the beam radius therein is about 2.7 mm, and the light beam on the observation plane is displaced 1 mm when the variation in angle is equivalent to 0.1 mrad.

Accordingly, the displacement of the light beam based on the beam radius is 1/2.7 0.37.

On the other hand, the displacement of the light beam based on the beam radius is 10/25=0.4.

As is apparent from a comparison between these numerical examples, the use of the lens 4b enables the best detection sensitivity to be obtained with the smallest distance.

The lens 4b is used also to match the beam size with the size of the photo-detecting areas of the photo-detectors 4c and 4d or of the gap therebetween.

In addition, when light reflected from the surfaces of the photo-detectors 4c and 4d returns to the laser resonator, oscillation may become unstable. Accordingly, an optical isolator may be inserted in the optical path branched by the beam splitter 4a.

In this case, the lens 4b is useful in facilitating the insertion of the optical isolator.

In general, the beam size directed to the diffraction grating 3a corresponds to a beam radius of several millimeters in order to obtain a high wavelength resolution of the diffraction grating 3a.

On the other hand, many commercial photo-detectors and optical isolators have an effective radius of 1 mm or smaller.

Consequently, the lens can be used to reduce the beam size to prevent a decrease in detection sensitivity arising from an inappropriate beam radius or shading caused by the optical isolator.

For simplification, this example uses the single convex lens, but a plurality of lenses may be combined together or curved mirrors may also be used. These additional lenses are effective if the beam radius must be adjusted or in other cases.

To vary the resonator length of the external cavity, not only the resonator length varying section 3d may be provided inside the diffraction section 3 but a second reflector may be translated, a drive current for the LD may be varied, a transmissive medium for varying the length of the optical path may be inserted into the external cavity to vary the thickness or reflectivity thereof.

(Third Embodiment)

Figure 6:
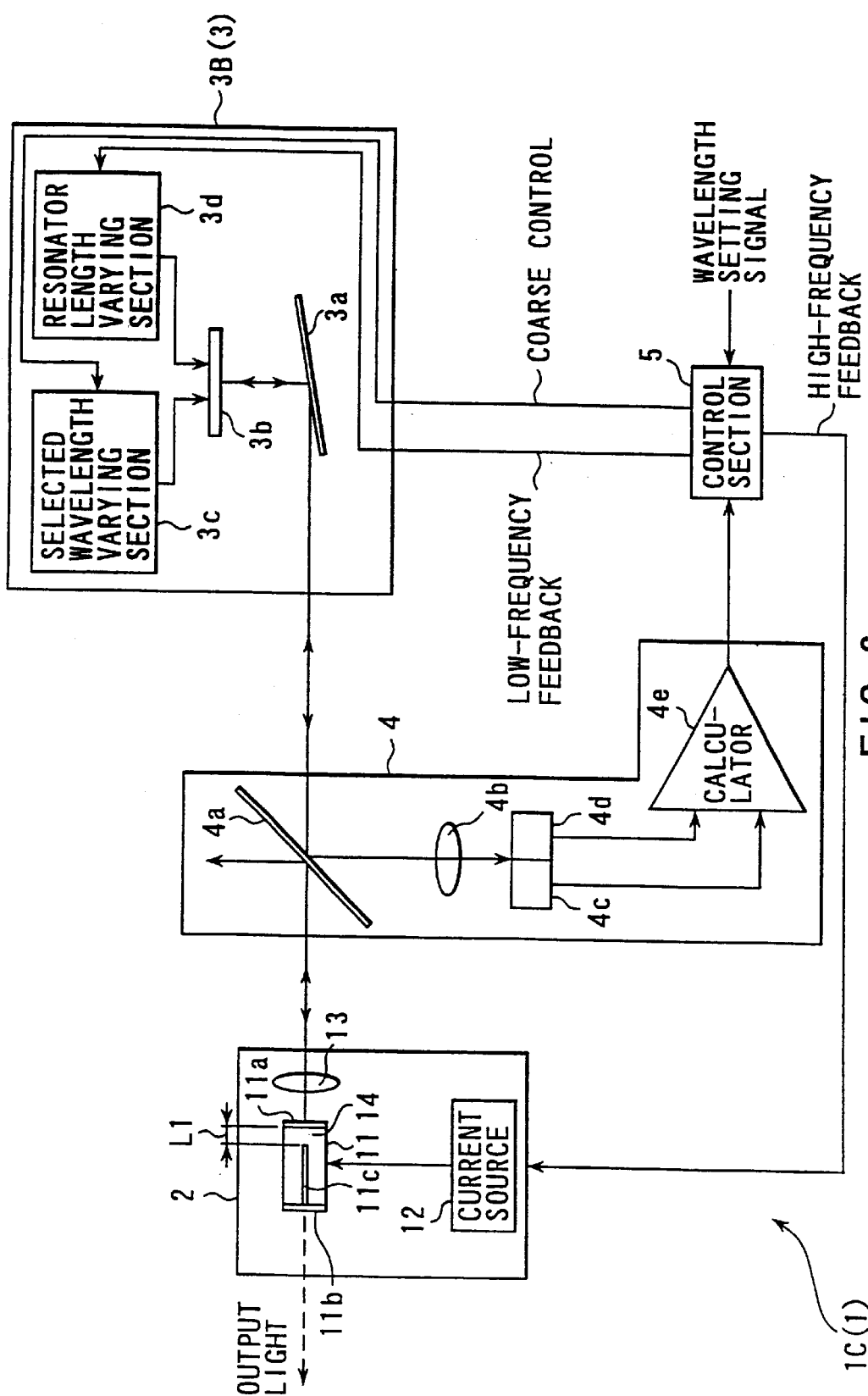
FIG. 6 is a is a block diagram showing a second embodiment of a tunable laser source apparatus according to the present invention.
Figure 8A:
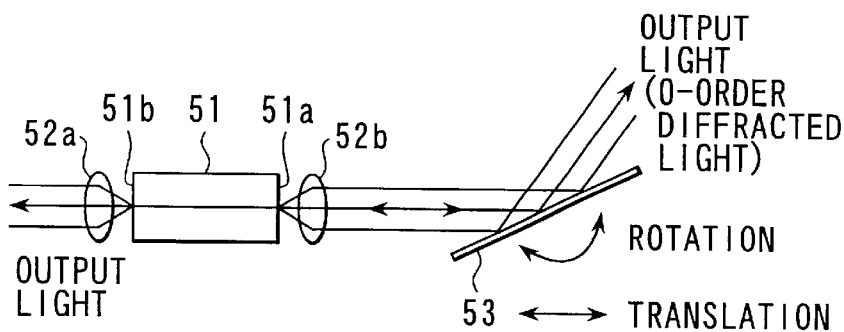
FIGS. 8A to 8E are views useful in explaining the principle of determination of an oscillating wavelength for a conventional external cavity laser using a diffraction grating, in which FIG. 8A(a) is a view showing the configuration of the external cavity laser using the diffraction grating.
Figure 8B:
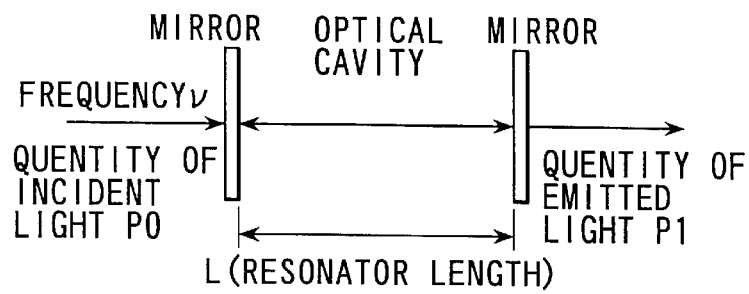
Figure 8C:
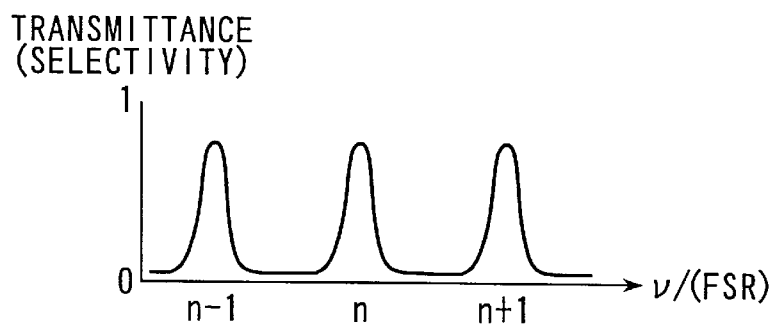
Figure 8D:
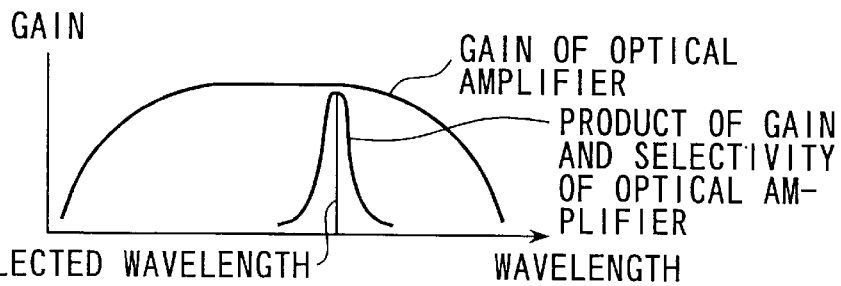
Figure 8E:
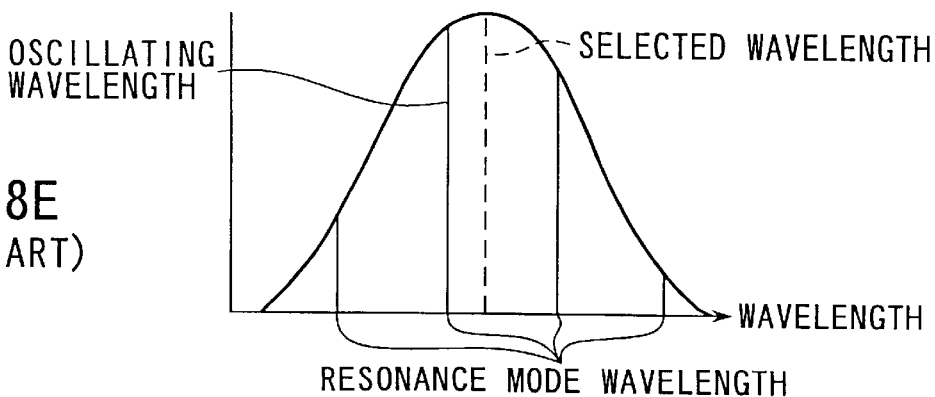

FIG. 6 is a block diagram showing the configuration of the third embodiment of the tunable laser source apparatus according to the present invention.

In FIG. 6, the same components as those of the second embodiment shown in FIG. 2 have the same reference numerals, and description thereof is omitted.

A tunable laser source apparatus 1C(1) according to the third embodiment principally comprises the optical amplifying section 2, the diffraction section 3B(3) as the wavelength selecting section including the diffraction grating 3a, the first reflector 3b, and the second reflector 3e, the angle detecting section 4, and the control section 5, as shown in FIG. 6.

That is, the tunable laser source apparatus 1C employs a configuration wherein the angle detecting section 4 is added to the external cavity laser using the diffraction grating 3a based on the Littman mounting, to achieve feedback control.

In this tunable laser source apparatus 1C, light incident on the diffraction grating 3a from the optical amplifying section 2 is diffracted, and the diffracted light (other than 0-order diffracted light) is reflected by the mirror 3b, the first reflector, and is then incident on the diffraction grating again and fed back to the optical amplifying section 2.

Thus, laser oscillation occurs between the one end surface 11b of the LD 11 and the diffraction grating 3a and the mirror 3b.

Such a laser oscillating configuration is called "Littman mounting".

The selected wavelength can be varied by rotating the mirror 3b, and the resonance wavelength can be varied by translating the mirror 3b.

Additionally, the configuration and operation of the control section 5 are similar to those of the tunable laser source apparatus 1B of the second embodiment except that the mirror 3b is moved and that a control signal comprising a low-frequency component is tea back to the resonator length varying section 3d, while a control signal comprising a high-frequency component is fed back to the current source 12.

Since the LD 11 is characterized to have its internal reflectivity varied by current flowing through an activated area or a phase control area, the resonator length of the external cavity can be varied by varying the drive current.

Accordingly, the resonator length is determined by the resonator length varying section 3d and the drive current from the current source 12 for the LD 11.

A resonator structure such as that in this example allows the diffraction grating 3a to achieve a high wavelength selectivity more easily than a resonator structure based on the Littrow mounting like the second embodiment shown in FIG. 2.

As a result, the diffraction angle varies significantly in response to a small variation in oscillating wavelength, thereby improving the detection sensitivity for variations in oscillating wavelength to enable the mode hop to be more reliably restrained.

Furthermore, the resonator length of the external cavity can be controlled at a high speed by feeding back the high-frequency component of the control signal as the drive current for the LD 11.

This is effective in preventing mode hop such as that caused by vibration which originates from a high-frequency disturbance and which cannot be mechanically followed.

In addition, if the wavelength is swept, the resonance wavelength must vary in a fashion following the sweeping of the selected wavelength.

The use of the current feedback to the LD 11 enables the resonance wavelength to follow at a high speed, thereby allowing the wavelength sweeping speed to be set high.

As described above, in the tunable laser source apparatuses 1A, 1B, and 1C shown in FIGS. 1, 2, and 6, the emission end surface 11a of the LD 11 opposite to the diffraction grating 3 side (diffraction grating 3a) is AR-coated, and the window region 14 is formed to prevent the active layer 11c from reaching the AR-coated end surface 11a. The apparatuses 1A, 1B, and 1C can thus sufficiently restrain internal modes of the LD 11 to reduce spontaneous emitted radiation.

As a result, the reflectivity can be equivalently improved to sufficiently restrain internal modes of the LD caused by residual reflectivity, to reduce spontaneous emitted radiation to thereby prevent multimode oscillation, while extending the wavelength varying range.

Figure 7A:
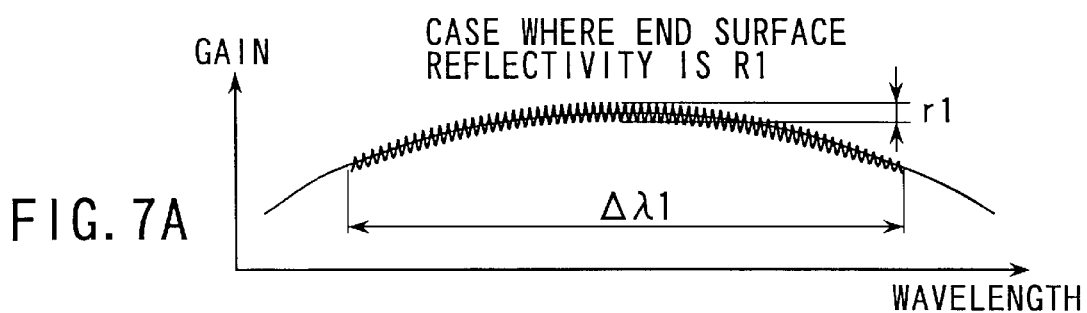
FIGS. 7A and 7B are graphs useful in explaining effects of the tunable laser source apparatus according to the present invention, showing a wavelength-gain characteristic based on the magnitude of end surface reflectivity which is observed when an LD is driven at a certain current value.
Figure 7B:
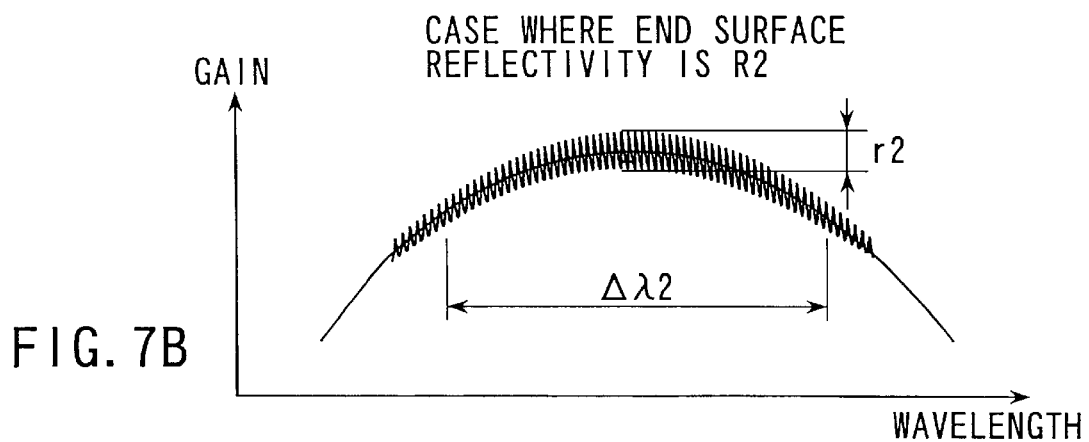

FIGS. 7A and 7B show a wavelength-gain characteristic based on the magnitude of end surface reflectivity which is observed when the LD is driven at a certain current value.

As shown in FIGS. 7A and 7B, end surface reflectivities obtained when the LD is driven at a certain current value are referred to as R1 and R2 (R1<R2) and compared together with respect to a gain spectrum characteristic, the reflectivity R2, which is higher than the reflectivity R1, has a higher gain peak but a narrower gain half width $\Delta\lambda2$.

With the tunable laser source apparatus 1 in this example including not only the surface with the anti-reflection film of the AR coating but also the window region 14 formed to prevent the activated area 11c from reaching the end surface 11a, the reflectivity is reduced compared to the prior art, thereby widening the gain half width $\Delta\lambda1$ despite the restrained peak gain.

The wavelength varying range can correspondingly be extended.

If, for example, the window region is 35 $\mu$m, the reflectivity can be reduced to one-tenth or less of that obtaied only with the anti-reflection coat, and the variable wavelength band can be extended to one between about 150 nm and about 200 nm.

In addition, with respect to multimode oscillation, the conventional structure may cause large ripples r in a spectrum due to its large residual reflectivity.

These ripples are preferably minimized because they may cause multimode oscillation or the fluctuation of output while the wavelength is varying.

According to the tunable laser source apparatus 1 (1A, 1B, and 1C) in this example, the amount of ripples can be reduced to about 0.5 dB from about 1.5 dB, which is measured when only the anti-reflection coat is provided.

As is apparent from the above description, according to the present invention, the emission end surface of the LD opposite to the diffraction grating side is AR-coated, and the window region is formed to prevent the active layer from reaching the AR-coated end surface. This configuration serves to provide a tunable laser source apparatus that can sufficiently restrain internal modes of the LD to reduce spontaneous emitted radiation to thereby prevent multimode oscillation, while extending the wavelength varying range.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A tunable laser source apparatus including an external cavity, the apparatus comprising:

a semiconductor laser including a reflection surface formed on one end, a surface with an anti-reflection film formed on the other end, and an active layer extending from said reflection surface toward a tip portion, a window region formed between the tip portion of said active layer extending toward said surface with the anti-reflection film of said semiconductor laser and said surface with the anti-reflection film of said semiconductor laser, and wavelength selecting means for selecting from laser light emitted from said semiconductor laser through said surface with the anti-reflection film and feeding laser light of a desired wavelength back to said semiconductor laser through said surface with the anti-reflection film, wherein said window region enables the laser light of the desired wavelength fed back from said wavelength selecting means to be coupling thereon, while dilating the beam size of a portion of the laser light which is reflected from said surface with the anti-reflection film to reach said tip portion film.

2. A tunable laser source apparatus including an external cavity according to claim 1, said apparatus further comprising:

angle detecting means for detecting an angle between an optical axis of light emitted from said semiconductor laser and an optical axis of diffracted light reflected from said wavelength selecting means; and a control section for changing at least one of a resonator length of said external cavity and a selected wavelength of said wavelength selecting means so that said angle detected by said angle detecting means is zero.

3. A tunable laser source apparatus including an external cavity according to claim 1, wherein said wavelength selecting means includes a diffraction grating and a reflector.

4. A tunable laser source apparatus including an external cavity according to claim 2, wherein said wavelength selecting means includes a diffraction grating and a reflector.

* * * * *